US012811019B2

(12) United States Patent
Wolfe et al.

(10) Patent No.: US 12,811,019 B2
(45) Date of Patent: Nov. 24, 2026

(54) CERAMIC COATING FOR CORROSION RESISTANCE OF NUCLEAR FUEL CLADDING

(71) Applicant: The Penn State Research Foundation, University Park, PA (US)

(72) Inventors: Douglas E. Wolfe, University Park, PA (US); Arthur M.T. Motta, University Park, PA (US); Timothy J. Eden, University Park, PA (US)

(73) Assignee: The Penn State Research Foundation, University Park, PA (US)

( * ) Notice: Subject to any disclaimer, the term of this patent is extended or adjusted under 35 U.S.C. 154(b) by 427 days.

(21) Appl. No.: 18/158,250

(22) Filed: Jan. 23, 2023

(65) Prior Publication Data

US 2023/0407453 A1 Dec. 21, 2023

Related U.S. Application Data

(63) Continuation of application No. 15/764,103, filed as application No. PCT/US2016/055263 on Oct. 4, 2016, now abandoned.

(Continued)

(51) Int. Cl.

*G21C 3/07* (2006.01)
*C23C 14/06* (2006.01)
*G21C 21/02* (2006.01)

(52) U.S. Cl.

CPC ............ *G21C 3/07* (2013.01); *C23C 14/0641* (2013.01); *G21C 21/02* (2013.01); *Y02E 30/30* (2013.01)

(58) Field of Classification Search

CPC ......... G21C 3/07; C23C 28/04; C23C 28/042; C23C 28/044

See application file for complete search history.

(56) References Cited

U.S. PATENT DOCUMENTS 4,926,792 A 5/1990 Bell et al.
5,026,517 A 6/1991 Menken et al.

(Continued)

FOREIGN PATENT DOCUMENTS

DE 19944509 A1 4/2001
EP 1010183 A1 6/2000

(Continued)

OTHER PUBLICATIONS

Parka, Jong Cheon, et al. "Thermal oxidation behavior of TiZrN-coated Inconel 617." Journal of Ceramic Processing Research 15.5 (2014): 351-354. (Year: 2014).*

(Continued)

*Primary Examiner* — Sharon M Davis
(74) *Attorney, Agent, or Firm* — Dinsmore & Shohl LLP

(57) ABSTRACT

A method of providing nuclear fuel cladding in a radioactive fuel reactor includes coating the nuclear fuel cladding with a coating system and exposing the nuclear fuel cladding in pure water at at least 360 °C and a saturation pressure of 18.7 MPa, where the coating system is maintained without spallation or delamination after at least 3 days. The coating system includes a multilayer coating on the substrate including (i) one or more layers including at least a ternary metal compound and at least a binary metal compound and (ii) a top coat layer that does not include aluminum, where the ternary metal compound includes TiCrN, TiNbN, TiSiN, TiHfN, TaHfN, TaNbN, TiCrC, TiNbC, TiSiC, TiHfC, TaHfC, TaNbC, TiCrCN, TiNbCN, TiSiCN, TiHfCN, TaHfCN, TaNbCN, or combinations thereof and the binary metal compound includes CrN, NbN, TaN, Si3N4, HfN, CrC, HfC, TaC, NbC or combinations thereof.

14 Claims, 6 Drawing Sheets

Related U.S. Application Data

(60) Provisional application No. 62/237,884, filed on Oct. 6, 2015, provisional application No. 62/305,358, filed on Mar. 8, 2016.

(56) References Cited

U.S. PATENT DOCUMENTS

| | | | | |
|---|---|---|---|---|
| 5,301,211 | A | 4/1994 | Bryan et al. | |
| 6,040,012 | A * | 3/2000 | Anderbouhr ........ | C23C 16/4488 427/255.394 |
| 8,088,501 | B2 | 1/2012 | Endrino | |
| 8,971,476 | B2 | 3/2015 | Mazzoccoli et al. | |
| 2002/0007796 | A1 * | 1/2002 | Gorokhovsky ..... | H01J 37/3266 427/580 |
| 2008/0102296 | A1 | 5/2008 | Ghasripoor | |
| 2010/0129644 | A1 | 5/2010 | Endrino | |
| 2014/0126683 | A1 | 5/2014 | Mazzoccoli et al. | |
| 2014/0187849 | A1 | 7/2014 | Bakker et al. | |
| 2015/0050521 | A1 | 2/2015 | Le Flem et al. | |
| 2015/0063523 | A1 | 3/2015 | Yacout et al. | |
| 2015/0063524 | A1 | 3/2015 | Yacout et al. | |

FOREIGN PATENT DOCUMENTS

| | | | |
|---|---|---|---|
| KR | 10-2006-0022769 | A | 3/2006 |
| WO | 1997031376 | A1 | 8/1997 |

OTHER PUBLICATIONS

Barshilia, Harish C., et al. "Structure, hardness and thermal stability of TiAlN and nanolayered TiAlN/CrN multilayer films." Vacuum 77.2 (2005): 169-179. (Year: 2005).*

Paldey, S. C. D. S., and S. C. Deevi. "Single layer and multilayer wear resistant coatings of (Ti, Al) N: a review." Materials Science and Engineering: A 342.1-2 (2003): 58-79. (Year: 2003).*

International Search Report issued in Application No. PCT/US2016/055263 dated Jan. 10, 2017.

E. Alat et al., "Multilayer (TIN, TiAlN) ceramic coatings for nuclear fuel cladding," Journal of Nuclear Materials, 478 2016) pp. 236-244.

E. Alat et al., "Ceramic coating for corrosion (c3) resistance of nuclear fuel cladding," Surface & Coatings Technology, 281 (2015) pp. 133-143.

F. Khatkhatay et al., "Superior corrosion resistance properties of TiN-based coatings on Zircaloy tubes in supercritical water," Journal of Nuclear Materials, 451 (2014) pp. 346-351.

Zalnezhad, E., and G. Faraji. "Fretting fatigue life investigation of AL7075-T6 alloy coated by multilayer thin solid films of TiCr/TiN/CrN and Ti/Cr/TiN/Cr/CrN/TiCrN." Proceedings of the Institution of Mechanical Engineers, Part J: Journal of Engineering Tribology 231.6 (2017): 686-692. (Year: 2017).

Ozlem Baran, Aysenur Keles, Hikmet Cicek, Yasar Totik, ihsan Efeoglu, The mechanical and tribological properties of Ti [Nb, V] N films on the Al-2024 alloy, Surface and Coatings Technology, vol. 332, 2017, pp. 312-318, (Year: 2017).

K. Bobzin, N. Bagcivan, P. Immich, C. Warnke, F. Klocke, C. Zeppenfeld, P. Mattfeld, Advancement of a nanolaminated TiHfN/CrN PVD tool coating by a nano-structured CrN top layer in interaction with a biodegradable lubricant for green metal forming, Surface and Coatings Technology, pp. 3184-3188, (Year: 2009).

Jing Gao, Yue Zhao, Zhiqing Gu, Sam Zhang, Mao Wen, Lulu Wu, Weitao Zheng, Chaoquan Hu, Improving electrical conductivity and wear resistance of hafnium nitride films via tantalum incorporation, Ceramics International, vol. 43, Issue 11, 2017, pp. 8517-8524, (Year: 2017).

Araujo, Juliano Avelar, et al. "Thick CrN/NbN multilayer coating deposited by cathodic arc technique." Materials Research 20 (2016) : 200-209. (Year: 2016).

C.A. Escobar, J.C. Caicedo, W. Aperador, Corrosion resistant surface for vanadium nitride and hafnium nitride layers as function of grain size, Journal of Physics and Chemistry of Solids, vol. 75, Issue 1, 2014, pp. 23-30, (Year: 2014).

Wei Yongqiang, Zang Xiaoya, Wu Zhongzhen, Tian Xiubo, Gong Chunzhi, Yang Shiqin, Jiang Zhiqiang, Chen Liangji, Effects of modulation ratio on microstructure and properties of TiN/TiAlN multilayer coatings, Surface and Coatings Technology, vol. 229, 2013, pp. 191-196, (Year: 2013).

E. Bemporad, M. Sebastiani, F. Casadei, F. Carassiti, Modelling, production and characterization of duplex coatings (HVOF and PVD) on Ti-6Al-4V substrate for specific mechanical applications, Surface and Coatings Technology, vol. 201, Issue 18,2007, pp. 7652-7662 (Year. 2007).

M. Moser, P.H. Mayrhofer, Yttrium-induced structural changes in sputtered Ti1-xAlxN thin films, Scripta Materialia, vol. 57, Issue 4, 2007, pp. 357-360, (Year: 2007).

* cited by examiner

CERAMIC COATING FOR CORROSION RESISTANCE OF NUCLEAR FUEL CLADDING

CROSS-REFERENCE TO RELATED APPLICATIONS

This application claims the benefit of U.S. patent application Ser. No. 15/764,103 filed Mar. 28, 2018, which claims the benefit of U.S. Provisional Application No. 62/237,884 filed Oct. 6, 2015 and U.S. Provisional Application No. 62/305,358 filed Mar. 8, 2016, the entire disclosures of both of which are hereby incorporated by reference herein.

GOVERNMENT SPONSORSHIP

The Government has certain rights in the invention. This invention was made with government support under Grant No. DE-AC07-05ID14517, awarded by the Department of Energy.

FIELD OF THE INVENTION

The present disclosure relates to coatings used for radioactive fuel, such as nuclear fuel cladding, and/or structural components in radioactive fuel reactors.

BACKGROUND OF THE INVENTION

Cladding is typically an outer layer of a radioactive fuel material, e.g., nuclear fuel rods, and is typically used to prevent radioactive fission fragments from escaping the fuel and entering coolant typically circulated around the fuel material and contaminating it. Cladding is typically made of a corrosion-resistant material with low absorption cross section for thermal neutrons.

Zirconium-based alloys are currently used as structural components and as nuclear fuel cladding in nuclear power reactors because of their low neutron absorption cross section, resistance to high temperature steam corrosion, good thermal conductivity, good mechanical properties and resistance to void swelling. However, under normal operating conditions zirconium-based nuclear fuel cladding alloys undergo waterside corrosion by the primary coolant water. A fraction of the hydrogen generated in the corrosion reaction, as shown in Eq. (1), may be picked up in the cladding and precipitate as hydrides which can lead to cladding embrittlement.

$$Zr+2H_2O \Rightarrow ZrO_2+2H_2 \quad \text{(Eq. 1)}$$

In the case of a loss-of-coolant-accident (LOCA), the cladding temperature may increase above 1200 °C when the corrosion reactions and corresponding hydrogen generation are significantly accelerated. The large amount of hydrogen generated during the Fukushima-Daichii accident during the 2011 Japan earthquake and tsunami caused explosions in the reactor building, which severely worsened the accident development. The Fukushima-Daichii accident has motivated research into Accident Tolerant Fuels (ATF), conceived as fuels that are more forgiving in the case of a loss-of-coolant accident, such that these fuels may increase the coping time to allow external intervention before severe fuel damage occurs. Current advanced cladding concepts include bulk silicon carbide (SiC), bulk ferritic alloy steel cladding, and others. Although they have the potential to ameliorate LOCA response, these concepts represent major engineering design changes to the reactor cores.

Clearly there are many challenges to developing a nuclear fuel cladding coating that is safe, effective, and economic, as the coated system must also have a variety of essential properties: adherence to the substrate, thermal stability to high temperature with maximum oxidation resistance, resistance to scratching/gauging and resistance to radiation damage.

U.S. patent application publications 2015/0050521 and 2015/0063523 relate to coatings for nuclear fuel. US 2015/0050521 discloses multilayer coatings including metallic layers and US 2015/0063523 discloses coating nuclear fuel cladding with a total thickness coating up to 1,000 nm (1 μm).

Ceramic TiN and TiAlN coatings have been widely used for years on high speed tool steels, cemented carbides, and cermet substrates for various cutting and finishing operations in the tooling industry. In terms of corrosion resistance, TiN provides good chemical inertness up to 600 °C depending on the metal to nitrogen ratio (stoichiometry).

One study assessed the oxidation resistance of TiN and $Ti_{0.35}Al_{0.65}N$ coatings on Zr-4 substrates, in which the coatings were deposited by pulsed lased deposition (PLD). See Khatkhatay et al., "Superior corrosion resistance properties of TiN-based coatings on Zircaloy tubes in supercritical water", J. Nucl. Mater. 451 (2014) 346-351.

The use of titanium as a bond coating and its effect on coating performance were studied before for TiN coatings on various stainless steel substrates. A study conducted by Bull et al. disclosed that adhesion improved in coatings deposited by plasma assisted chemical vapor deposition (PACVD) as Ti interlayer thickness increased, reaching a maximum of 150 nm bond coating thickness for coatings produced by sputter ion plating. See Bull et al. The influence of titanium interlayers on the adhesion of titanium nitride coatings obtained by plasma-assisted chemical vapour deposition, Mater. Sci. Eng. A. 139 (1991) 71-78. However, no work has been done to investigate the effect of Ti interlayer between either TiAlN or TiN coating on the corrosion resistance of ZIRLO® substrates.

However, there is still a need for improved coatings used in radioactive fuel, such as nuclear fuel cladding, and/or structural components in radioactive fuel reactors.

SUMMARY OF THE INVENTION

An advantage of the present disclosure is a coating useful for radioactive fuel or a structural component in a radioactive fuel reactor, e.g., nuclear fuel cladding alloys. Such coatings are corrosion resistance in the environment of a radioactive fuel reactor.

These and other advantages are satisfied, at least in part, by a coating system on a substrate used for radioactive fuel or a structural component in a radioactive fuel reactor. The coating system comprises a multilayer coating on the substrate including (i) one or more layers including a ternary metal compound, e.g., a ternary metal nitride, ternary metal carbide, ternary metal oxide or combinations thereof such as ternary metal carbonides, oxynitrides, oxycarbides, etc., and (ii) a top coat layer that does not include aluminum.

In some embodiments, the one or more layers can comprise a nitride, oxide, or carbide or mixed combination (i.e., carbonides, oxynitrides, oxycarbides, etc.) from Ti, Al, Zr, Cr, Si, Nb, Hf, or mixed combination (i.e., $TiAlC_{1-y}N_y$, wherein the value of y completes the valancy for the compound). Ternary or binary metal compounds of such can include TiAlN TiZrN, TiCrN, TiNbN, TiHfN, TaHfN, TaNbN, or mixed combinations and/or CrN, ZrN, NbN, TiN, TaN, $Si_3N_4$, and/or HfN, for example. In other embodiments, the multilayer coating includes one or more layers of TiAlN TiZrN, TiCrN, or TiNbN as the ternary metal compound and/or one or more layers of CrN, ZrN, NbN, or TiN as binary compounds. In still further embodiments, the TiAlN layer can have the formula of $Ti_{1-x}Al_xN$, where x can be between about 0.1 and about 0.9, for example. The number of layers can range from 2-1000 layers, such as from about 4, 6, 8, 16, 32, etc. layers or from about 4 to 32 or 4 to 20 layers. The coating can have a total coating thickness within a thickness range of 0.2 micron to 35 microns or higher e.g., from about 1 micron to about 20 microns, in which the coating is directly or indirectly on a structural component in radioactive fuel reactor.

In one aspect of the present disclosure, the coating is doped with a dopant, e.g., at least one of the layers of the multilayer coating is doped with one or more dopants, e.g., a rare earth metal (e.g., Y, Yb, etc.) or a metal from group IVB and group VB. In some embodiments the dopant is in an amount of from about 0.1 atomic % to about 25 atomic % of one or more layers of the coating. The multilayer coating can be directly or indirectly deposited on radioactive fuel or on a structural component in radioactive fuel reactor.

Another aspect of the present disclosure includes a process for preparing a coating system provided above. The process comprises applying the multilayer coating of any one of the embodiments described above by either a physical vapor deposition (PVD) coating process or chemical vapor deposition (CVD) and its derivatives, or a mixed PVD/CVD system on to radioactive fuel or a structural component used in a radioactive fuel reactor. In an embodiment of the present disclosure, the process includes process applying the coating system by cathodic arc PVD. Applying a coating by cathodic arc PVD is accomplished by vaporizing the target material under vacuum via an electric arc and allowing the ionized target atoms (and reactant gas species) to deposit on the substrate.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein.

DETAILED DESCRIPTION OF THE DRAWINGS

Figure 1:
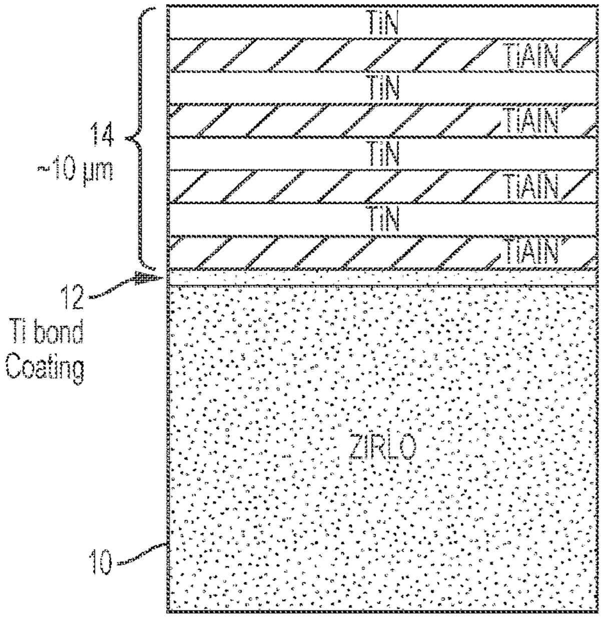
FIG. 1 is a schematic illustrating a coating system on a ZIRLO® substrate in accordance with an embodiment of the present disclosure.

The present disclosure relates to coatings used for radioactive fuel, such as nuclear fuel cladding, and/or structural components in radioactive fuel reactors. As explained in the Background Section above, an approach to addressing the problem of improving nuclear fuel cladding was to change the materials used for the nuclear fuel cladding. The present disclosure advantageously provides a protective, multilayer coating system that can improve the corrosion characteristics of currently used zirconium-based claddings without requiring a major change in cladding material. This approach can also advantageously have the benefit of reducing corrosion and hydrogen pickup during normal operation, further improving design safety. While the coating system of the present disclosure can be used with conventional cladding, it is versatile enough that it can be used with new cladding materials as well.

In one aspect of the present disclosure, a substrate can advantageously be protected by a coating system. Substrates contemplated by the present disclosure include those used for radioactive fuel or a structural component in a radioactive fuel reactor. Substrates that can benefit from the present disclosure include those comprising zirconium-based alloys, steel, FeCrAl and SiC, for example. Nuclear fuel cladding can also benefit from the coating system f the present invention. Such cladding materials can be composed of a zirconium-based alloy, steel, FeCrAl, SiC, etc. The fuel cladding can be ZIRLO®, or another zirconium-based alloy, or steel cladding in which the coating system of the present disclosure advantageously provides improvements in oxidation resistance.

In an embodiment of the present disclosure, the coating system on a substrate used for radioactive fuel or a structural component in a radioactive fuel reactor includes a multilayer coating on the substrate. The multilayer coating includes: (i) one or more layers including a ternary metal compound, e.g., a ternary metal nitride, ternary metal carbide, ternary metal oxide or combinations thereof such as ternary metal carbonides, oxynitrides, oxycarbides, etc., and (ii) a top coat layer that does not include aluminum, e.g., the top coat does not include aluminum either as the metal or alloy thereof.

As an example, one or more layers of the multilayer can comprise a nitride, oxide, or carbide or mixed combination (i.e., carbonides, oxynitrides, oxycarbides, etc.) from Ti, Al, Zr, Cr, Si, Nb, Hf, or mixed combination (i.e., $TiAlC_{1-y}N_y$, wherein the value of y completes the valancy for the compound). Ternary metal compounds can include TiAlN TiZrN, TiCrN, TiNbN, TiHfN, TaHfN, TaNbN, or mixed combinations and binary metal compounds can include CrN, ZrN, NbN, TiN, TaN, $Si_3N_4$, and/or HfN, for example. In some embodiments, the TiAlN layer can have the formula of $Ti_{1-x}Al_xN$, where x can be between about 0.1 and about 0.9, for example. The number of layers can range from 2-1000 layers, such as from about 4, 6, 8, 16, 32, etc. layers or from about 4 to 20 layers. The coating can have a total coating thickness within a thickness range of 0.2 micron to 35 microns or higher, e.g., from about 1 micron to about 20 microns, in which the coating is directly or indirectly on a structural component in radioactive fuel reactor.

In some embodiments, the multilayer coating includes one or more layers of TiAlN TiZrN, TiCrN, or TiNbN as the ternary metal compound and or one or more layers of CrN, ZrN, NbN, or TiN as the binary metal compound. In other embodiments, the top layer comprises TiN or some other metal nitride, carbide, oxide, or combinations thereof that do not include aluminum.

The individual layers of the multilayer coating can have a thickness greater than 0.1 μm, such as greater than 0.5 μm and even greater than about 0.75 μm. In an aspect of the present disclosure, the individual layers have a thickness in a range of between 0.1 μm-2 μm.

The coating system can further include a bond coat on the substrate and the multilayer coating on the bond coat. In some embodiments, the bond coat can have a thickness of no less than 0.2 μm, preferably no less than 0.6 μm, such as a thickness of greater than about 1 μm. In one aspect of the present disclosure, the bond coat has a thickness between 0.2 μm to 1.5 μm. The bond coat can comprise Ti, Cr, Zr, Nb and/or another transition metal or alloys thereof.

In still further embodiments, at least one of the one or more of layers is doped with one or more dopants.

Figure 2:
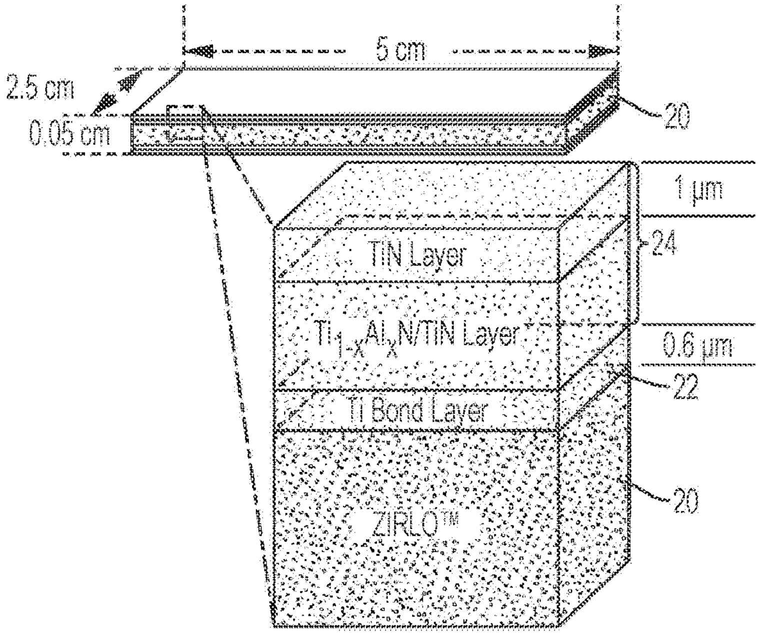
FIG. 2 is another schematic illustrating a coating system on a ZIRLO® substrate in accordance with another embodiment of the present disclosure.

FIGS. 1 and 2 illustrate certain embodiments of the present disclosure. These embodiments show a coating system including multiple layers of TiAlN and TiN with a TiN top coat over a ZIRLO® substrate. FIG. 1 shows ZIRLO® substrate 10 having a titanium bond coat 12 thereon and a multilayer coating of alternating TiAlN and TiN with a TiN top coat 14 over the bond coat. As shown in the figure, the multilayer coating has a total thickness of about 10 microns. FIG. 2 shows ZIRLO® substrate 20 having a coating system on both major surfaces thereof which include titanium bond coat 22 having a thickness of about 0.6 microns thereon and a multilayer coating of TiAlN and TiN with a TiN top coat 24 over the bond coat 22. As shown in the figure, the TiN top coat has a thickness of about 1 micron.

In some embodiments, the coating system can comprise one or more layers of TiAlN and TiN with a TiN top coat. In terms of corrosion resistance, TiN provides good chemical inertness up to 600 °C depending on the metal to nitrogen ratio (stoichiometry). Titanium aluminum nitride (TiAlN), formed by incorporation of Al into TiN, is a good coating candidate for high temperature oxidation resistance and improved wear/abrasion resistance and toughness under extreme environments. The ternary nitrides composed of a combination of two binary nitrides can produce coatings with properties which exceed that of the individual binary coatings (i.e., solid solution hardening). Titanium nitride and aluminum nitride nano domains co-exist in $Ti_{1-x}Al_xN$ for $0.7>x>0.6$ which improve the coating mechanical properties by significantly increasing the hardness and Young's modulus of the material. It further improves the oxidation/corrosion resistance (upwards of 800-1000 °C), improves thermal stability, improves wear/abrasion resistance and toughness. This increased corrosion resistance is due to the formation of a dense $Al_2O_3$ layer that reduces outward aluminum diffusion and inward oxygen diffusion in the protective film. In principle, during corrosion at high temperature aluminum diffuses to the surface and reacts with oxygen to form a thin protective oxidation barrier ($Al_2O_3$) which significantly improves the oxidation performance as oxygen diffusion through aluminum oxide is several orders of magnitude lower than through zirconium oxide. Moreover, previous studies also showed that oxidation initiation depends on the aluminum content of the TiAlN coating, thus increasing the aluminum content leads to an increase in the oxidation resistance. Several other factors that contribute to the corrosion resistance of the TiAlN coatings include microstructure, residual stress and extreme environmental conditions.

Application of an interlayer (bond coating) improves the adhesion between the coating and the substrate. The bond coat can be made of Ti, Cr, Zr, Nb, Ta or other transition metal and/or alloys thereof and/or nitrides/carbides/oxides thereof. The main reason for improved adhesion and coating system performance is the dissolution of substrate oxides (gettering effect) to promote adhesion, provide increased compliance and by accommodating high compressive coating residual stress across the coating substrate interface from the deposition technique. If the bond coat is too thin, it cannot absorb extrinsic (thermal) stresses associated with coating degradation exposed to extreme environmental conditions such as oxidation, moisture, or elevated temperatures. Thickness of bond coat is no less than 0.2 μm, preferably no less than 0.6 μm, such as a thickness of greater than about 1 μm. In one aspect of the present disclosure, the bond coat has a thickness between 0.2 μm to 1.5 μm. The bond coat can comprise Ti, Cr, Zr, Nb and/or another transition metal or alloys thereof.

Additionally, it has been pointed out the importance of thermal expansion coefficient matching to achieve better adhesion between the substrate and the coating, claiming that a large mismatch between the thermal expansion coefficients in between them will result in poor adhesion. Accordingly, in choosing the interlayer material, one has to consider thermal expansion coefficients of the substrate and the coating material. In the case of TiAlN and TiN coatings deposited by cathodic arc evaporator, the coefficient of thermal expansion (CTE) of TiAlN was determined to be $7.5\times10^{-6}\ K^{-1}$ while that of TiN is $9.4\times10^{-6}\ K^{-1}$. Previous studies showed that thermal expansion behavior of ZIRLO® and Zircaloy-4 is similar for the temperature range of 290-400 °C. Accordingly, CTE of ZIRLO® can be assumed to be $\sim6.3\times10^{-6}\ K^{-1}$ at 360 °C. Therefore, application of a titanium bond coating would be expected to improve adhesion since its CTE of $8.5\times10^{-6}\ K^{-1}$ (at room temperature), lies in between that of the substrate and the coating.

In addition, different coating process parameters such as substrate temperature, bias voltage, arc current and nitrogen pressure allow the coating properties to be tailored for application-specific use in extreme environments. As an example, the properties of a multilayer coating including TiN and TiAlN was improved through a systematic investigation of the effect of bias voltage, $N_2$ partial pressure and cathode composition on arc deposited coating properties. The substrate bias affects film microstructure, coating composition (Al content in TiAlN coating), impinging ion energy on the growing film (i.e., residual stress, density) which leads to a denser coating, backscattering of target atoms, and surface texture. Another effect of bias voltage is related to the reaction kinetics; a high bias voltage results in increased substrate surface temperature, thus increasing the kinetic energy of ions which facilitates the chemical reaction ($Ti+½N_2 \rightarrow TiN$) by overcoming the activation barrier at much lower temperatures as compared to standard equilibrium conditions. Additionally, nitrogen content (i.e., partial pressure) affects the coating composition, crystallography, hardness, toughness, wear/abrasion performance and degree of adhesion.

Figure 3:
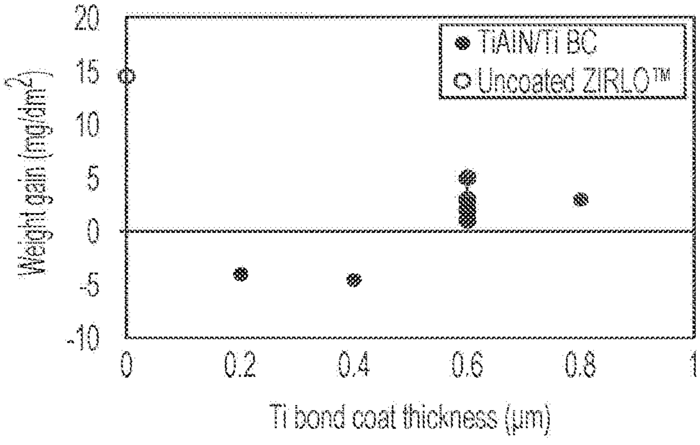
FIG. 3 is a chart showing sample weight gain data with respect to Ti bond coat thickness with TiAlN (~13 μm thickness) top coating after autoclave test exposure at 360 °C for 3 days. A coating of about 0.6 μm Ti bond coat thickness was an optimal minimum value for coating durability and to prevent spallation during the corrosion tests for the deposition conditions studied.

As stated above, the bond coating can have a significant effect on the top coating adhesion and coating system performance as it can dissolve substrate oxides promoting adhesion as well as accommodate high compressive residual stress from the deposition technique due to its compliancy. If the bond coat is too thin, it cannot absorb extrinsic stresses associated with coating degradation exposed to extreme environmental conditions such as oxidation or moisture. The effect of titanium bond coating thickness on total coating system corrosion resistance was investigated by depositing various Ti BC thicknesses. Thicknesses of 0.2 (E1), 0.4 (E2), 0.6 (E3) and 0.8 (E4) μm were achieved with a deposition times of 6, 8, 10, 15 min respectively, as previously shown in Table 2, which indicates a proportionality between the deposition time and the coating thickness. However, depending on the sample geometry and coating deposition parameters, these can be varied and controlled. After Ti BC deposition, a TiAlN coating with a thickness of ~13 μm was deposited and these samples were then subjected to the corrosion testing. The weight gain data collected after the corrosion testing for these samples is presented in FIG. 3. The samples with 0.2 and 0.4 μm bond coat thickness suffered weight loss, indicating an unstable coating layer in which coating delamination occurred during corrosion. The thicker bond coating samples showed better behavior: the average weight gain of both thicker (0.6 and 0.8 μm) bond coat samples was minimal compared to that of the uncoated ZIRLO® sample. The 0.8 μm bond coating thickness showed a positive weight gain of only 3 $mg/dm^2$ and no indication of coating spallation under visual inspection while the 0.6 μm samples showed a similarly low average weight gain without spallation. The absence of delamination and the minimal weight gain indicate that these bond layer/coating thickness value combinations provided good protection for increased durability against cladding corrosion under the autoclave conditions selected.

SEM analysis was conducted to further investigate the coating performance and durability after corrosion test exposure. The SEM surface micrographs from a sample with a bond coating thickness of 0.6 μm show areas of coating failure and areas where the coating was intact. The overall weight gain data was negative for this particular sample, which was confirmed by the presence of coating spallation. However, SEM provides good insight into the surface morphology of the TiAlN-based coatings after 3 days of exposure when the bond coating is applied to the desired requirements and what occurs when the bond coat is not optimized for subsequent coating deposition. SEM examination confirms that there were delaminated regions, indicating poor coating adhesion; cracks were observed around delaminated regions which are attributed to stresses caused by oxide formation of the underlying ZIRLO® substrate.

Visual inspection of the coating samples with thicker bond coating show no coating delamination, which, combined with low weight gain, resulted in the 0.6 μm BC being selected for further optimization of the TiAlN/TiN coating system in subsequent coating generations. Although a small amount of delamination was observed on some of the 0.6 μm samples, other samples showed no delamination, indicating that 0.6 μm is close to the optimal thickness required to form a good adhesion layer for the particular system studied.

To determine the phases present in the coating layers and to further evaluate the coating performance after corrosion exposure, x-ray diffraction analysis was performed. The XRD results were consistent with the uncoated ZIRLO® (ICDD PDF #00-005-0665) exhibiting the hexagonal closed packed crystal structure with prevailing basal fabrication texture, leading to a high intensity of the (0002) peak. The XRD pattern of coated ZIRLO® in the as-deposited condition, with a 0.6 μm Ti BC layer, followed by a ~13 μm thick TiAlN layer was analyzed. The XRD peaks can be indexed as, a TiAlN cubic rocksalt structure with a lattice parameter of 0.42 nm ($Ti_{0.5}Al_{0.5}N$, ICDD PDF #04-005-5251). Accordingly, Energy Dispersive Spectroscopy (EDS) analysis showed that the coating composition was $Ti_{1-x}Al_xN$, in the as deposited condition where x=0.54-0.67 depending on deposition conditions.

The XRD pattern of the same sample after corrosion testing showed new phases formed. The new peaks were indexed and identified as belonging to the anatase (ICDD PDF #04-002-8296) and boehmite phases (ICDD PDF #00-021-1307) when combined with EDS data. The presence of these phases indicates a possible degradation mechanism of the TiAlN coating in which aluminum diffuses to the outer surface where it reacts with water under autoclave conditions. Previously, Khatkhatay et al. J. Nucl. Mater. 451 (2014) 346-351 also determined anatase phase formation in case of $Ti_{0.35}Al_{0.65}N$ coatings deposited by pulsed laser deposition after corrosion testing at 500 °C and 25 MPa for 48 h. Although, the coating composition and corrosion test condition in this study were different, anatase phase formation was also observed at the XRD pattern of the current study; however, different from the results presented in the study of Khatkhatay et al., boehmite phase formation was observed. For aluminum, the boehmite phase is sometimes produced in the form of a corrosion resistant layer to protect an underlying metallic aluminum alloy. On the contrary, in this study, boehmite formation did not occur on a pure aluminum substrate but occurred on the TiAlN coating surface.

In the as-coated XRD pattern, a slight shift to higher angles in the TiAlN peak was observed, possibly indicating compressive strains in the coating as has been previously observed for TiAlN coatings on ZIRLO® substrate deposited by CA-PVD process. Additionally, there was a slight shift of the Zr peaks towards lower 2θ values, again possibly indicating tensile strains which is attributed to the balancing of the coating compressive strains. After the autoclave test, it was determined that TiAlN, anatase and most of the boehmite phase peaks shifted towards lower 2θ values as compared to the literature (unstressed) values, indicating tensile strains in the newly formed phases, possibly caused by strain relaxation as a result of aluminum depletion during autoclave testing. It is also possible that the peak shift is caused by variations in composition in the phases studied.

The main results of the first generation were: (i) A 0.6 μm thick Ti bond coating between the ZIRLO® substrate and the TiAlN top coating is enough to achieve good layer adhesion to the substrate and corrosion resistant coating performance; (ii) Boehmite phase with nonuniform distribution forms on top of TiAlN coatings as a result of outward migration of aluminum after 3 days of autoclave test at 360 °C and 18.7 MPa; (iii) Although boehmite phase formation was observed, TiAlN coating was determined to provide good protection against corrosion of Zr alloys according to an order of magnitude decrease in the weight gain data compared to the uncoated ZIRLO® for the short term study investigated. However, Formation of boehmite is detrimental due to its high growth rate and poor adhesion which results in spallation and subsequent oxidation and therefore recession of the coating. Boehmite formation was prevented when utilizing TiN layers which do not produce the boehmite phase. Thus, it was discovered that producing multilayer coatings with an exterior top coat that does not include aluminum, such as TiN, can act as a barrier for boehmite phase formation and such a multicoating system can benefit from advanced properties of the underlying layers and top layer to form significantly improved coatings with high temperature corrosion resistance.

GEN-2: Surface Roughness and Coating Thickness

PVD coatings containing high levels of compressive stress often result in poor coating durability if the deposited coating thickness exceeds 12 microns, as the internal intrinsic coating stresses can often exceed the interfacial adhesion strength. This results in a lower critical load for coating spallation. The occurrence of this phenomenon depends on multiple factors, including environment, temperature, material systems, microstructure and design architecture. In general, a rougher substrate results in better coating adhesion, as there is a larger number of atomic bonds for a rougher substrate as compared to a smooth substrate. Improved coating adhesion results from the mechanical interlocking of the layer on the rougher substrate.

Figures 4A, 4B:
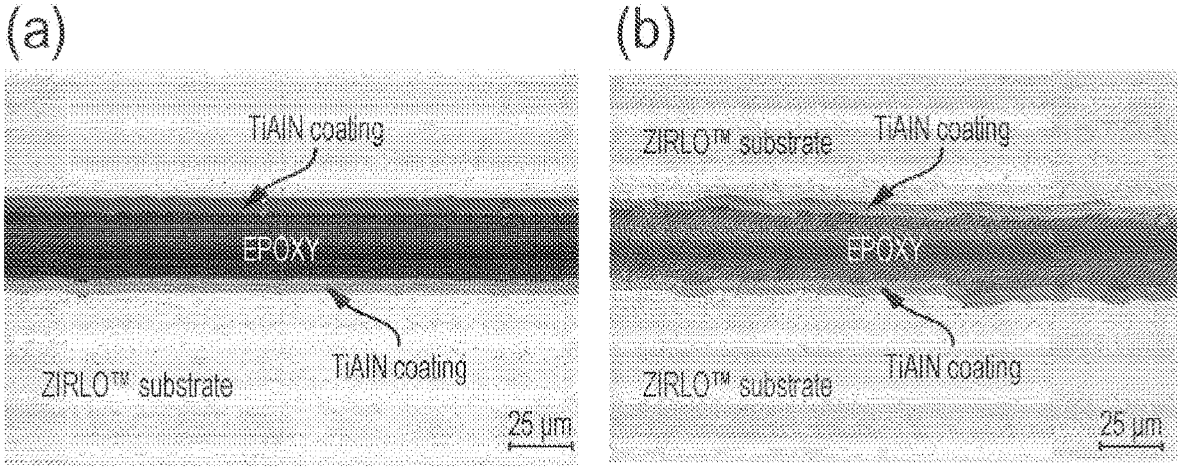
FIGS. 4(*a*)-4(*b*) are optical microscope images showing the polished cross section of TiAlN (~8 μm) deposited onto a ZIRLO® substrate with Ti BC of 0.6 μm in the as deposited condition have a substrate surface roughness of (a) 0.25 μm $R_a$ (E10) and (b) 0.875 μm $R_a$ (E12), respectively.

Second generation coatings investigated the influence of ZIRLO® substrate surface roughness ($R_a$) and TiAlN coating layer thickness on corrosion resistance. To investigate the substrate surface roughness effect on coating durability, ZIRLO® substrate surface roughness values of 0.1, 0.25, 0.5 and 0.875 μm $R_a$ were prepared prior to coating deposition. Additionally, to investigate the effect of the TiAlN top coat thickness on corrosion resistance coatings with 4, 8 and 12 μm thickness were deposited on ZIRLO® substrate coupons (with fixed 0.6 μm Ti BC thickness layer). As an example to demonstrate the appearance of substrate surface with different roughness, optical microscopy images of the polished cross sections for samples (E10 and E12) with 0.25 μm $R_a$ and 0.875 μm $R_a$ in the as deposited state (before autoclave testing) are presented in FIGS. 4*a* and 4*b*, respectively, where the difference in substrate surface roughness is evident.

Figure 5:
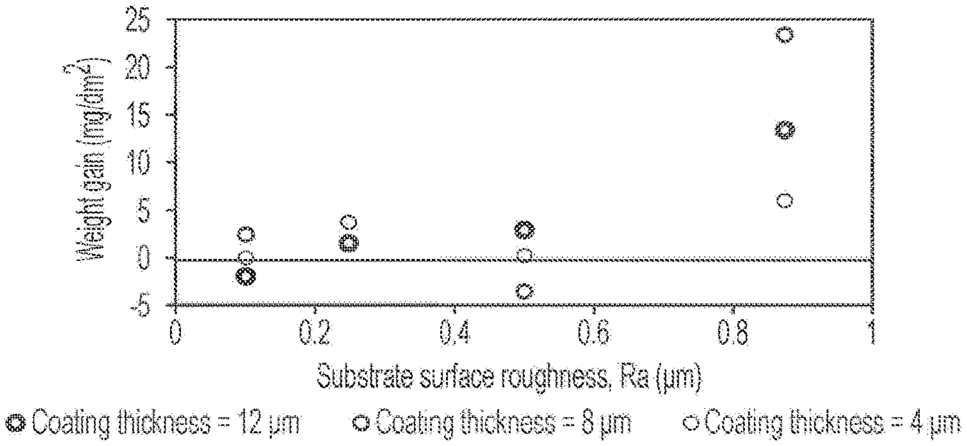
FIG. 5 is a chart showing weight gain data as a function of ZIRLO® substrate surface roughness values and TiAlN coating thickness values after autoclave testing at 360 °C for 3 days.

After the autoclave test, the sample weight gain was measured to evaluate the effect of surface roughness and optimum coating thickness on corrosion resistance, which is presented in FIG. 5. The weight gain data demonstrated that although samples with various coating thicknesses and a 0.875 μm substrate surface roughness prior to the autoclave test showed no delamination they showed the highest weight gain compared to the samples with smaller substrate surface roughness. On the contrary, samples with 0.1 and 0.5 μm $R_a$, showed negative weight gain, indicating coating delamination. The lowest weight gain and no delamination was obtained with 0.25 μm $R_a$ substrate surface roughness, so this was the surface roughness chosen as the optimal value. Among the samples with 0.25 μm $R_a$, the lowest weight gain was obtained in the sample with coating thickness of 12 μm so this was chosen as the optimum thickness value.

The weight gain of uncoated ZIRLO® weight gain was 14.4 mg/dm$^2$ after 3 days at 360 °C and saturation pressure in agreement with previous studies, which translates to about 1 μm oxide thickness. From the findings of the first generation, it was interpreted that the weight gain in the samples was due in large part to the existence of the boehmite phase, which forms according to the reaction:

$$Al+2H_2O \rightarrow AlO(OH)+3/2H_2 \quad \text{(Eq. 2)}$$

Figures 6A, 6B:
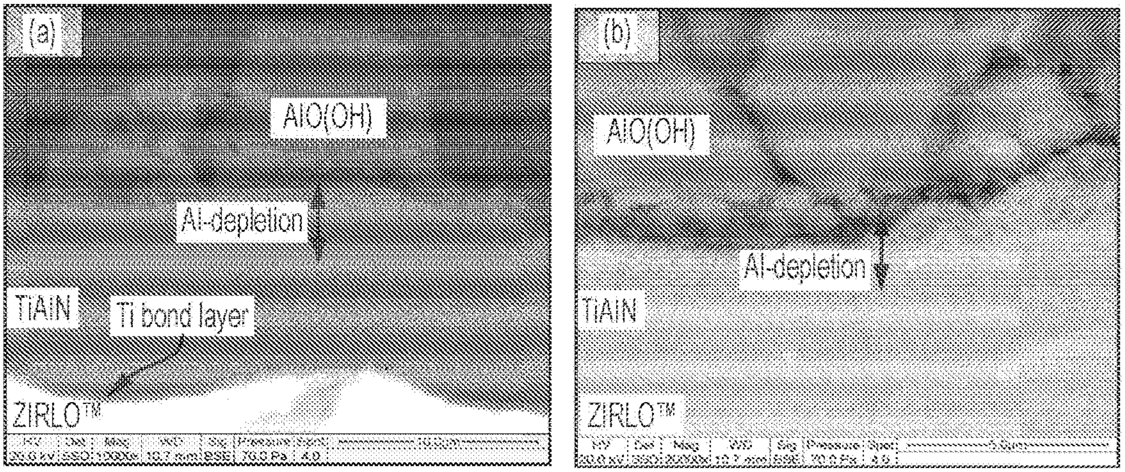
FIGS. 6(*a*)-6(*b*) are secondary electron SEM image and (b) Backscattered electron SEM image. These images were obtained from a polished cross section of a GEN-2 TiAlN/Ti/ZIRLO® sample, following autoclave testing for 3 days at 360 °C. Aluminum migration from the TiAlN coating is observed to have occurred in the top 4 microns of the 10 μm thick TiAlN. The phase, boehmite (AlOOH), appears to have grown on the outer surface, above the TiAlN coating. The layers are 'wavy' because the ZIRLO® substrate was roughened before coating deposition.

To confirm aluminum migration, and the boehmite phase thickness, SEM analysis of the polished cross sections was performed, as presented in FIG. 6. Cross section SEM images show a higher concentration of Al at the layer/water interface after corrosion, consistent with aluminum migration from the TiAlN coating. This Al has been shown to have migrated from top 4 μm of the 10 μm-thick TiAlN layer. The boehmite (AlO(OH)) phase appears to have grown on the outer surface, above the TiAlN coating. SEM analyses revealed that the thickness of this phase is not uniform, reaching up to ~5 μm in certain regions of the coating.

Further examination was performed using EDS in order to determine the composition of the sample surface. EDS data shows that the majority of both the white and dark regions on the TiAlN coated surface were rich in aluminum as evident by the higher aluminum to titanium ratio (greater than 2). In general, the white regions (see FIG. 6) appeared to show a greater concentration of aluminum, but this is attributed to a greater volume of the boehmite phase changing (masking) the EDS interaction volume, thus changing the depth within the coating from which EDS data is obtained. These results suggest that aluminum depletion occurred within the TiAlN coating under the autoclave conditions studied, resulting in the formation of the boehmite phase when exposed to high temperature/pressure water during the autoclave test.

The main results of the second generation were: (i) The thickness of the boehmite phase formed is not uniform but appears to nucleate at grain boundaries; (ii) Despite the formation of boehmite phase during corrosion, the combination of a 0.25 μm $R_a$ substrate surface roughness and a 12 μm top coat layer thickness provide the optimum coating characteristics to obtain best adhesion for CA-PVD TiAlN coatings on ZIRLO® substrates with Ti BC.

GEN-3: Coating Process Parameters

For GEN-3, in an effort to minimize or eliminate boehmite phase formation, cathodic arc deposition parameters were varied in order to improve the coating microstructure and properties for corrosion resistance. The effect of changes in nitrogen partial pressure, substrate bias, and coating composition (TiAlN versus TiN; i.e., eliminating the aluminum content) on corrosion behavior were investigated. Varying the coating parameters resulted in different weight gain data.

The effect of variation of coating deposition parameters is shown in Table 1 by adding the weight gain data to the parameters previously introduced in Table 2. Uncoated ZIRLO® shown in Table 1 had 14.4 mg/dm$^2$ weight gain after 3 days of autoclave test, $N_2$ pressure was 1.6 Pa during coating deposition in GEN-1 and GEN-2. In the current generation, sample E18 was synthesized by increasing the $N_2$ pressure slightly to 1.9 Pa. Another sample (E19) was produced with both slightly increased $N_2$ pressure (1.9 Pa) and increased substrate bias to 100 V from 50 V. Coating thickness and the substrate surface roughness were kept at ~12 μm and 0.25 μm $R_a$ respectively.

Visual examination and SEM analysis showed that there was no delamination after the autoclave test in the samples coated with a slightly increased (1.9 Pa) $N_2$ pressure, which mentioned an increase in adhesion of TiAlN coatings deposited by CA-PVD as the $N_2$ partial pressure increased from 1 to 5 MPa. However, this pressure change (1.9 MPa) resulted in a higher average weight gain value of 17 mg/dm$^2$, which is much larger than that measured for the sample (E14) having the same coating thickness and surface roughness, but deposited with 1.6 Pa $N_2$ pressure. In a literature study for arc processes, changing the nitrogen partial pressure did not influence the aluminum content of the TiAlN coating, but there has been no study to date on the effect of nitrogen partial pressure increase on the titanium content of the TiAlN coating composition. This increase in weight gain due to increased nitrogen partial pressure was attributed to lower titanium content and less protective phase formation due to increased nitrogen content in the coating.

The data presented in Table 1 also showed that increased substrate bias slightly improved corrosion resistance of the layers, as shown by the lower weight gain of 10.1 mg/dm$^2$. This suggests that the increased bias resulted in a denser coating which provided increased resistance to corrosion. Previous studies on TiAlN coatings deposited by CA-PVD showed that increased bias results in decreased aluminum content, which could lead to a lower amount of protective $Al_2O_3$ which is undesired for corrosion resistant coatings. In the current study, lower weight gain was obtained and this situation can be explained with similar reasoning. The weight gain was attributed to boehmite phase formation and accordingly it can be evaluated that the lower weight gain leads to less boehmite phase formation due to decreased aluminum content with increased bias. It is also possible that this lower weight gain can be attributed to the smoother surface texture, which can decrease the oxidation sites, increase compressive stresses, and modify the microstructure with fine grains with reduced porosity which results in having a denser coating.

of nitrogen showed mixed results with regards to weight gain and the effects on corrosion are indeterminable. The variation in the corrosion weight gain results is attributed to a combination of weight loss due to coating spallation and weight gain due to the boehmite formation for previous generations, making direct comparison difficult. Further studies are required to confirm the relative impact of coating processing parameters and optimization on the corrosion performance of these coatings.

The exact nucleation and growth mechanism of the boehmite phase on the TiAlN is still not completely understood, but is believed to be initiated at the $Ti_{1-x}Al_x$ N grain boundaries which are rich in aluminum due to aluminum diffusion. This is supported by the appearance of non-uniform growth on the surface of the $Ti_{1-x}Al_x$ N in which there appears to be a pattern to the boehmite phase formation. The authors suspect that the larger boehmite regions are the sites where aluminum migration first occurred and reacted with the water to form boehmite which then grew with increased exposure. With increasing test duration, aluminum migration continued due to the chemical potential gradient within the Al depleted region of the TiAlN coating. However, this mechanism needs to be verified by performing a systematic study of autoclave testing and transmission electron microscopy analysis. SEM images support this reasoning in which there appears to be localized nucleation and growth on the TiAlN coating surface. This hypothesis is further supported from the literature in that boehmite has been shown to nucleate at grain boundaries for pure aluminum metal at elevated temperature.

Figures 7A, 7B, 7C, 7D:
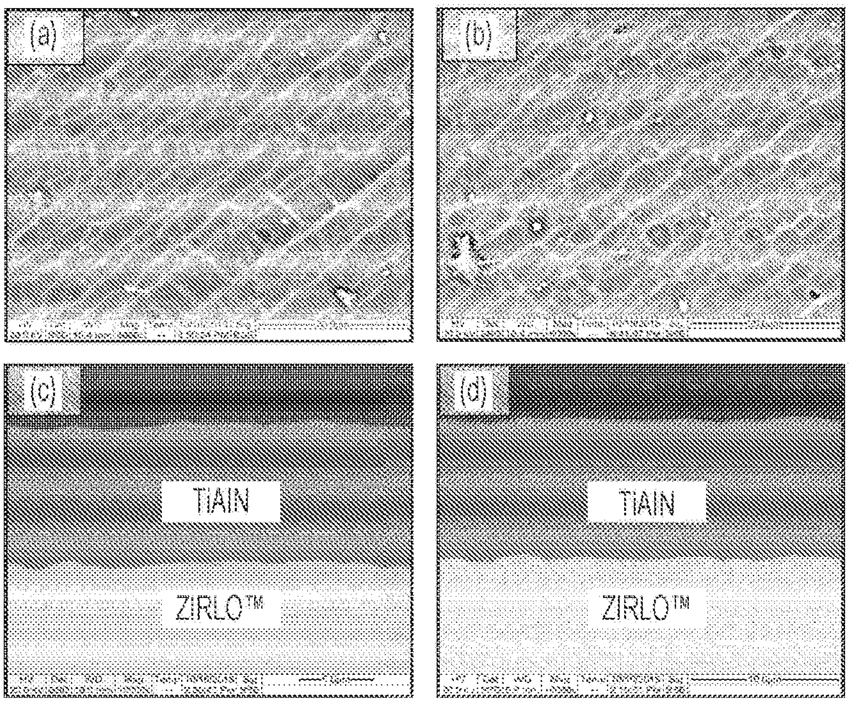
FIG. 7(*a*)-(*d*) are SEM image of the surface morphology of TiN coated ZIRLO®; (a) before autoclave testing, (b) after autoclave testing, and the polished cross section of TiN coated ZIRLO® (c) before and (d) after autoclave testing. As shown by the polished cross sections, no boehmite phase is detected on the surface of the autoclave sample.

The last parameter tested in GEN-3 was that samples were prepared with an external layer of TiN deposited by CA-PVD to evaluate its ability to stop Al migration and boehmite phase formation. TiN had the lowest weight gain of 1.2 mg/dm$^2$ in average after the autoclave test, with no delamination and correspondingly a significant improvement in the corrosion resistance. An SEM analysis on surface and cross sections of the TiN coated samples is presented in FIG. 7, showing that there was no outward migration of Al and no boehmite phase formation. FIG. 7(*a*)-(*d*) are SEM image of the surface morphology of TiN coated ZIRLO®; (a) before autoclave testing, (b) after autoclave testing, and the polished cross section of TiN coated ZIRLO® (c) before and (d) after autoclave testing. As shown by the polished cross sections, no boehmite phase is detected on the surface of the autoclave sample.

Further, coatings with a TiN outer layer remained intact with no indication of coating debonding and/or oxygen penetration through the coating. This strongly suggests that TiN is a corrosion resistant layer to protect the ZIRLO® substrate, which supports the conclusion that was reached by Khatkhatay et al. for TiN coatings deposited on Zr-4 substrate. See Khatkhatay et al., J. Nucl. Mater. 451 (2014) 346-351.

TABLE 1

Cathodic Arc Physical Vapor Deposition Parameters with the weight gain value after the autoclave test for TiAlN coating fabrication.

| ID | Coating | Ra (μm) | Coating Thickness (μm) | Substrate Bias (BC/TC) | $N_2$ partial pressure (Pa) | Weight gain (mg/dm$^2$) |
|---|---|---|---|---|---|---|
| E14 | TiAlN | 0.250 | ~12 | 150/50 | 1.6 | 1.5 |
| E18 | TiAlN | 0.250 | ~12 | 150/50 | 1.9 | 17 |
| E19 | TiAlN | 0.250 | ~12 | 150/100 | 1.9 | 10.1 |
| ZIRLO ® | No coating | 0.250 | N/A | N/A | N/A | 14.4 |

Table 1 shows select weight gain averages for GEN-3 coatings deposited as a function of nitrogen partial pressure and substrate bias. In general, a higher substrate bias results in a denser coating which was expected to minimize the formation of the boehmite phase by retarding aluminum migration. In addition, the increase in nitrogen partial pressure was expected to assist in modifying the metal/nitrogen ratio as it was believed that unreacted or lightly bound aluminum was diffusing to the coating surface and reacting with the water forming the boehmite phase. However, as shown in Table 1, changing the bias and the partial pressure The main results of the GEN-3 study are: (i) An increase in nitrogen partial pressure showed a slight degradation of properties of the coating for the deposition conditions studied; (ii) An increase in substrate bias slightly improves corrosion resistance, but the magnitude of the change is less than that effected by a change in nitrogen partial pressure for the deposition condition studied; (iii) an outer layer without aluminum, such as of a TiN coating, was shown to be effective in stopping Al migration and boehmite phase formation.

The results of this study provide a set of parameters and conditions that improve the resistance of the deposited layer to autoclave corrosion. Finally, we should mention that the neutronic effect of the layers used was evaluated and found to be quite small for the layer thicknesses and compositions studied, giving confidence that this is a promising approach to creating an accident tolerant fuel.

In addition to providing a coating used for radioactive fuel or a structural component in a radioactive fuel reactor that includes a coating comprising a ternary monolithic coating or multiple layers of one or more layers of TiAlN TiZrN, TiCrN, TiNbN and/or CrN, ZrN, NbN, TiN, TiHfN, TaHfN, TaNbN, or mixed combinations and/or CrN, ZrN, NbN, TiN, TaN, $Si_3N_4$, and/or HfN. In addition, one or more layers can be comprised of a nitride, oxide, or carbide or mixed combination (i.e., carbonides, oxynitrides, oxycarbides, etc.) from Ti, Al, Zr, Cr, Si, Nb Hf, or mixed combination (i.e., $TiAlC_{1-x}N_x$). The present disclosure also provides such coatings that doped with one or more dopants. In an aspect of the present disclosure, coatings used for radioactive fuel or a structural component in a radioactive fuel reactor can include a coating comprising a ternary monolithic coating or multiple layers of one or more layers of TiAlN TiZrN, TiCrN, TiNbN and/or CrN, ZrN, NbN, TiN in which at least one of the layers is doped with one or more dopants. The coatings can be prepared by applying the coating on radioactive fuel or a structural component used in a radioactive fuel reactor by either a physical vapor deposition (PVD) coating process (such as cathodic arc, sputtering (magnetron, HIPIMS, ion plating, pulsed laser deposition, evaporation, EB-PVD, etc.) or chemical vapor deposition (CVD) and its derivatives, or a mixed PVD/CVD system. Examples of such techniques include, but are not limited to, physical vapor deposition (PVD), cathodic arc PVD, steered cathodic arc PVD, filtered cathodic arc PVD, plasma-assisted PVD, laser-assisted PVD, DC magnetron sputtering, DC magnetron reactive sputtering, RF magnetron sputtering, unbalanced magnetron sputtering, high power impulse magneton sputtering, chemical vapor deposition (CVD), plasma-assisted CVD, laser-assisted CVD, plasma enhanced CVD, photo-enhanced VCD, meal-organic VCD, atmospheric pressure CVD, ion plating, pulsed laser deposition, atomic laser deposition, cold spray, thermal spray, solution plasma spray, solution precursor plasma spray, plating, reactive evaporation, and reactive ion beam assisted deposition, and/or mixed combination, derivative or hybrid process.

Dopant that are useful for the present disclosure include, for example, one or more of a rare earth metal or a metal from group IVB, such as zirconium and hafnium, and group VB. In an embodiment of the present disclosure, a layer, e.g., the top coat, ternary monolithic layer or a layer of the multilayer coating (e.g., one or more layers of TiAlN TiZrN, TiCrN, TiNbN and/or CrN, ZrN, NbN, TiN) is or are doped with one or more of one or more of Yb, Y, Hf, Zr, or other Rare Earth element. The amount of dopant in the various layers can vary. In one aspect of the present disclosure, the amount of dopant is in an amount of from about 0.1 atomic % to about 25 atomic % of one or more layers of the coating. In another embodiment of the present disclosure, the amount of dopant can be range from about 0.5 atomic % to about 10 atomic percent, e.g., from about 0.5 at % to about 4.0 at % of one or more layers of the coating. The dopant can be included in multilayer coating by evaporating the dopant along with other components when preparing the multilayer coating either as a separate component or as part of a target containing the other components to prepare the multiple layer coating. Manufacturing techniques can include chemical vapor deposition, physical vapor deposition and hybrid PVD/CVD.

Figure 9:
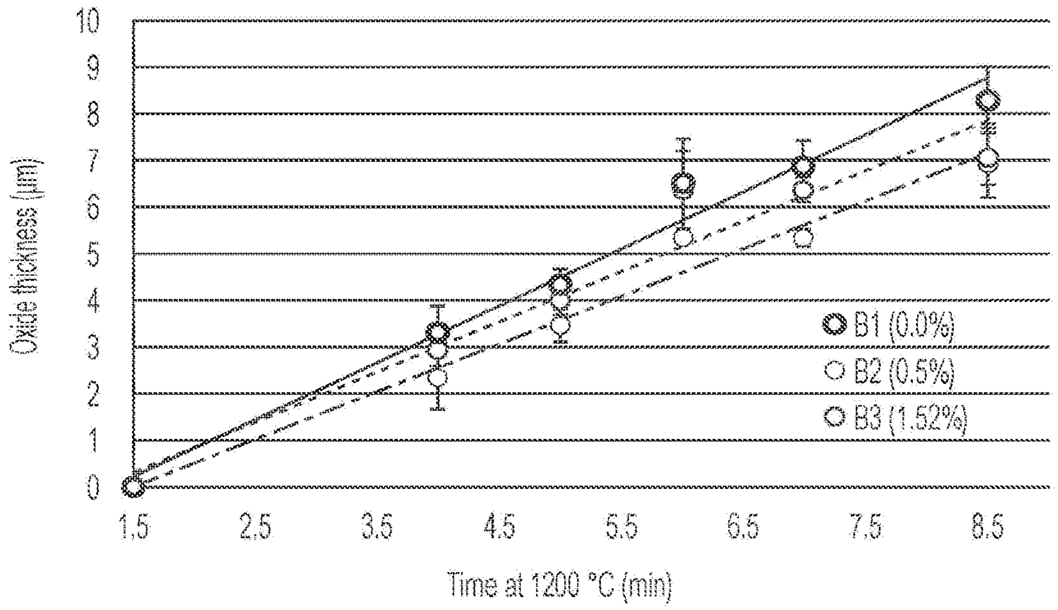
FIG. 9 is a chart of oxide thickness as a function of dopant concentration over time.

FIG. 9 shows oxide thickness as a function of time for Yb-doped titanium aluminum nitride coatings B1, B2, and B3 (0.0, 0.5, 1.52 at. % Yb respectively). Low concentrations of dopants can be seen to reduce the oxide thickness relative to the coating with dopants at all times.

The multilayer coating of the present disclosure can be used for radioactive fuel or a structural component in radioactive fuel reactors comprising a multilayer coating of one or more layers of TiAlN or TiN. The Examples below show that TiAlN and TiN monolayer ceramic coatings applied to ZIRLO® coupons improved corrosion resistance in high temperature water. Both types of coatings adhered well to ZIRLO® with proper surface preparation and with an application of a Ti bond coating layer of the proper thickness. Coating parameters were optimized to achieve a coating that would withstand 3 days at 360 °C with minimal weight gain, and no penetration of oxygen, no cracking, and no debonding. A Ti bond layer with 0.6 μm thickness and a substrate surface roughness of 0.25 μm $R_a$ provided the smallest weight gain. However, XRD, SEM and EDS measurements showed that there was some egress of Al in TiAlN coatings, which reacted with water and caused the formation of the boehmite phase. In comparison, boehmite phase formation was not observed in TiN coated samples since outward migration of aluminum was suppressed.

We conclude that a TiAlN CA-PVD layer with an outer TiN layer can be effective in increasing corrosion resistance of ZIRLO®, as long as the optimal surface bond coat, layer thickness, surface roughness, $N_2$ pressure and bias are applied. Optimum TiN thickness value can be determined for the guidance provided herein to form the barrier for the boehmite and evaluate the effect of multilayer coatings.

EXAMPLES

The following examples are intended to further illustrate certain preferred embodiments of the invention and are not limiting in nature. Those skilled in the art will recognize, or be able to ascertain, using no more than routine experimentation, numerous equivalents to the specific substances and procedures described herein.

These experiments describe steps towards creating a protective coating of TiAlN on ZIRLO®, with the focus on optimizing the coating layer thickness, substrate surface roughness, coating composition and cathodic arc physical vapor deposition (CA-PVD) processing parameters such as $N_2$ partial pressure and substrate bias, to achieve high temperature corrosion resistant coatings that are well adherent and protective of the underlying ZIRLO® substrate.

Materials and Coating $Ti_{1-x}Al_xN$ (where x is between about 0.54 and about 0.67) and TiN (henceforth referred to as (TiAlN or TiN), respectively) coatings were deposited on ZIRLO® coupons using cathodic arc physical vapor deposition (CA-PVD). ZIRLO® was provided by Westinghouse in the form of cold-worked stress-relieved sheet material of the typical clad thickness (~600 microns) with the usual fabrication texture in which the basal poles are preferentially oriented in the normal or radial direction. The chemical composition of ZIRLO® is nominally 1% Nb, 1% Sn, 300-600 wt ppm Fe and balance Zr. The ZIRLO® sheets were cut into coupons (2.54 cm×5.08 cm×0.043 cm) for subsequent coating surface preparation, deposition and corrosion testing. Each coupon had a small hole (1.6 mm) drilled near one end, and which was used for hanging the coupons in an autoclave tree during corrosion testing. The coupons were prepared by hand grinding the edges and corners with 240 grit SiC paper and the surfaces with 240, 600, and 800 grit SiC paper in that sequence to obtain the desired surface roughness of 0.1-0.875 μm (4-35 microinch). The samples were then cleaned in an ultrasonic cleaner with acetone for 10 minutes, deionized water rinse, followed by ultrasonic cleaning for 10 minutes in methanol, deionized water rinse and nitrogen gas blow dry. Roughness measurements were done using a SJ-201P Surface Roughness Tester.

Coating Deposition

All the coatings were deposited using cathodic arc physical vapor deposition (CA-PVD) which can be scaled to production-sized components. The term PVD denotes those vacuum deposition processes where the coating material is evaporated or removed by various mechanisms (resistant heating, ablation, high-energy ionized gas bombardment, or electron gun), and the vapor phase is transported to the substrate forming a coating. In the CA-PVD process, a continuous or pulsed high current-density, low voltage electric current is passed between two separate electrodes (cathode and anode) under low pressure vacuum, vaporizing the cathode material while simultaneously ionizing the vapor, forming a plasma. The high current density (usually $10^4$-$10^6$ A/cm$^2$) causes arc erosion by vaporization and melting while ejecting molten solid particles from the cathode surface, with a high percentage of the vaporized species being ionized with elevated energy (50-150 eV) and causing some species to be multiply charged. In summary, applying a coating by cathodic arc PVD is accomplished by vaporizing the target material under vacuum via an electric arc and allowing the ionized target atoms (and reactant gas species) to deposit on the substrate. The high ionization and energy of the vapor species result in an intermixing of the coating/substrate interface which results in increased coating adhesion compared to other PVD processes. In addition, the higher energy of the plasma (i.e., vapor) allows for tailorability of the coating microstructure, density, and residual stress state. When the cathodic species is evaporated in a nitrogen-rich, carbon-rich, or other reactant gas species results in nitrides, carbides, carbonitrides, etc. which provides increased versatility of the process.

In the case of TiAlN, as the material vaporized from the titanium-aluminum (cathode target) passes through the arc it becomes ionized, forming a plasma. The plasma is directed towards the substrate's surface, and in the presence of nitrogen, forms a TiAlN coating. The kinetic energies of the depositing species in cathodic arc are much greater than those of other PVD processes. Therefore, the plasma becomes highly reactive as a greater percentage of the vapor is ionized. In addition, the cathodic arc process allows tailoring of the interfacial products, especially in multilayer coatings, and does not produce a distinct coating/substrate interface. As a result of the high kinetic energy, CA-PVD coating residual stresses are generally compressive, which can be controlled by deposition parameters. These compressive stresses can prevent the formation and propagation of cracks in the coating. Moreover, in order to minimize thermal expansion mismatch based stresses, the PVD process is performed at 200 °C-500 °C. High vacuum pressures are commonly required for PVD techniques to achieve the large mean free path which makes evaporated atoms travel from the source material to the substrate in a straight path ("line-of-sight" process).

The main disadvantage of CA-PVD is the metal macro particle production due to either droplet formation because of low melting point materials (Al in case of TiAlN) during arc evaporation or intense, localized heating by the arc, which become entrapped within the depositing coating and serve as stress concentrations and crack initiation sites or incompletely ionized excess atoms that coalesce to macro particles during flight towards the substrate. Several methods that were previously applied to decrease these macro particles include application of a straight duct particle filter and plasma refining by electromagnetic field, which avoid deposition of larger macro particles on the substrate.

In the current study, the CA-PVD process was performed in a chamber with dimensions of 50.8 cm×50.8 cm×50.8 cm. For the coating deposition process two cathodes of different composition were used: dished high purity (99.999%) elemental titanium (for the bond coating) and titanium aluminum (33 at. % Ti-67 at. % Al) for the top coating to enhance corrosion protection at elevated temperature), which were individually evaporated by Miller XMT 304 CC/CV DC welder power supplies. These cathodes were cylindrical with a diameter of 6.3 cm and a thickness of 3.2 cm and were oriented 1800 from each other with the ZIRLO® coupons located between the cathodes with a spacing of 22.9 cm. The plasma density and location were controlled by placing magnets behind the cathode targets. The samples were mounted in sample holders which were in turn mounted on an 8-post planetary rotation setup with shadow bars along the edge of each sample to avoid increased coating buildup along the sample edges. The substrate coupon temperature was 325 °C during coating deposition, as measured by thermocouples placed inside the deposition chamber.

At the cathode vaporization stage, $1.6\times10^{-3}$ Pa Ar atmosphere and −1000 V bias were applied to remove the native oxide from the substrate surface and improve coating adhesion. The ion preheat time used was 5 minutes total. The deposition was conducted in two steps: bond layer deposition under Ar atmosphere using only the titanium cathode, followed by either TiAlN or TiN top coating reactive deposition performed under $N_2$ atmosphere at an approximate deposition rate of 0.028 μm/min (1.68 μm/hour) by using only one titanium aluminum or titanium cathode target. The system is capable of using three sources simultaneously which could be used to double or triple the coating deposition rate, if needed.

The deposition parameters were systematically varied and grouped according to generations. In the first generation (GEN-1), the thickness of the bond coating was optimized by depositing and corrosion testing samples with titanium bond coating (BC) thicknesses values of 0.2, 0.4, 0.6 and 0.8 μm. In the second generation (GEN-2), both the ZIRLO® coupon surface roughness before deposition (0.1 to 0.875 μm) and total coating thickness (4 to 12 μm) were evaluated for their impact on corrosion performance. The primary variable investigated in generation 3 (GEN-3) samples was composition, i.e., removing the aluminum content from TiAlN to form TiN to determine its resistance to forming the boehmite phase. The deposition parameters for the three generations of coatings are summarized in Table 2.

TABLE 2

Cathodic Arc Physical Vapor Deposition Parameters for TiAlN and TiN coating fabrication.

| ID | GEN | Coating | Ra (μm) | Coating Thick-ness (μm) | Deposition time (BC/TC) (min) | Substrate Bias (BC/TC) | $N_2$ partial press. (Pa) | Varying Parameter | Wt Gain ($mg/dm^2$) |
|---|---|---|---|---|---|---|---|---|---|
| E1 | 1 | TiAlN | 0.250 | ~13 | 6/450 | 150/50 | 1.6 | Ti BC-0.2 μm | −4 |
| E2 | 1 | TiAlN | 0.250 | ~14 | 8/450 | 150/50 | 1.6 | Ti BC-0.4 μm | −4.5 |
| E3 | 1 | TiAlN | 0.250 | ~12 | 10/450 | 150/50 | 1.6 | Ti BC-0.6 μm | 2.2 |
| E4 | 1 | TiAlN | 0.250 | ~14 | 15/450 | 150/50 | 1.6 | Ti BC-0.8 μm | 3 |
| E5 | 2 | TiAlN | 0.100 | ~4 | 8/112.5 | 150/50 | 1.6 | TiAlN = 4 μm<br>Ra = 0.1 μm | 0 |
| E6 | 2 | TiAlN | 0.250 | ~4 | 8/112.5 | 150/50 | 1.6 | TiAlN = 4 μm<br>Ra = 0.25 μm | 3.9 |
| E7 | 2 | TiAlN | 0.500 | ~4 | 8/112.5 | 150/50 | 1.6 | TiAlN = 4 μm<br>Ra = 0.5 μm | 0.5 |
| E8 | 2 | TiAlN | 0.875 | ~4 | 8/112.5 | 150/50 | 1.6 | TiAlN = 4 μm<br>Ra = 0.875 μm | 6 |
| E9 | 2 | TiAlN | 0.100 | ~8 | 8/225 | 150/50 | 1.6 | TiAlN = 8 μm<br>Ra = 0.1 μm | 2.5 |
| E10 | 2 | TiAlN | 0.250 | ~8 | 8/225 | 150/50 | 1.6 | TiAlN = 8 μm<br>Ra = 0.25 μm | N/A |
| E11 | 2 | TiAlN | 0.500 | ~8 | 8/225 | 150/50 | 1.6 | TiAlN = 8 μm<br>Ra = 0.5 μm | −3.5 |
| E12 | 2 | TiAlN | 0.875 | ~8 | 8/225 | 150/50 | 1.6 | TiAlN = 8 μm<br>Ra = 0.875 μm | 23.5 |
| E13 | 2 | TiAlN | 0.100 | ~12 | 8/450 | 150/50 | 1.6 | TiAlN = 12 μm<br>Ra = 0.1 μm | 1.5 |
| E14 | 2 | TiAlN | 0.250 | ~12 | 10/450<br>8/225 | 150/50 | 1.6 | TiAlN = 12 μm<br>Ra = 0.25 μm | −2 |
| E15 | 2 | TiAlN | 0.500 | ~12 | 8/450 | 150/50 | 1.6 | TiAlN = 12 μm<br>Ra = 0.5 μm | 3 |
| E16 | 2 | TiAlN | 0.875 | ~12 | 8/450 | 150/50 | 1.6 | TiAlN = 12 μm<br>Ra = 0.875 μm | 13.5 |
| E18 | 3 | TiAlN | 0.250 | ~12 | 8/450 | 150/50 | 1.9 | slightly increased $N_2$ pressure | 17 |
| E19 | 3 | TiAlN | 0.250 | ~12 | 8/450 | 150/100 | 1.9 | increased substrate bias to 100 V and $N_2$ pressure | 10.1 |
| E20 | 3 | TiN | 0.250 | ~12 | 8/370 | 150/150 | 1.6 | Composition (TiN) | 1.2 |

*BC = bond coat,
TC = Top coat

Only select coating discussions will be provided regarding the sample matrix in Table 2.

Corrosion Testing

Corrosion testing was performed at Westinghouse in a static autoclave in pure water for 3 days at 360 °C and saturation pressure, corresponding to 18.7 MPa at this temperature. Weight gain measurements were performed following the autoclave test to assess the coating durability and corrosion resistance. Post-autoclave coatings were analyzed by X-ray diffraction (XRD), optical microscopy (OM), scanning electron microscopy (SEM) and energy dispersive X-ray spectroscopy (EDS). Both surface and cross-section analyses were performed. Surface analyses were conducted directly after the autoclave test without any surface treatment to preserve the surface integrity. Analyses of coating cross section samples were conducted after cutting samples into half, mounting in cold mount epoxy, grinding and polishing. XRD studies were conducted on a PANalytical XPert Pro Multi-Purpose Diffractometer (MPD) instrument with 240 mm radius, fixed divergence slit (0.25°), receiving slit (0.25°), Cu $K_\alpha$ ($K_\alpha 1$=1.54056 Å, $K_\alpha 2$=1.54443 Å) radiation. Bragg-Brentano scans were performed with a step size of 0.0260 two-theta. Backscatter and secondary electron scanning electron microscopy (SEM) measurements were conducted using a FEI Quanta 200 Environmental SEM at 80 Pa pressure and 20 kV high voltage.

Multilayer System with Top Coat without Aluminum

Multilayer coatings were deposited onto ZIRLO® 1 coupon substrates by cathodic arc physical vapor deposition (CA-PVD). Coatings were composed of alternating TiN (top) and Ti1-xAlxN (2-layer, 4-layer, 8-layer and 16-layer) to investigate the minimum TiN top coating thickness necessary and optimum coating architecture for good corrosion and oxidation resistance. Corrosion tests were performed in static pure water at 3600 °C and 18.7 MPa for up to 90 days. Coatings having no spallation/delamination survived the autoclave test exposure with a maximum 6 $mg/dm^2$ weight gain, which is 6 times smaller than that of the uncoated ZIRLO™ sample having a weight gain of 40.2 $mg/dm^2$. A top layer of about 1 m of TiN prevented boehmite formation and TiN/TiAlN 8-layer architecture provided best corrosion performance due to no boehmite phase formation, no delamination/spallation and oxygen ingress prevention.

As described above, the coatings were deposited using cathodic arc physical vapor deposition (CA-PVD). For the following samples, the CA-PVD process was performed in a chamber with dimensions of 50.8 cm×50.8 cm×50.8 cm. For the coating deposition process two cathodes of different composition were used: dished high purity (99.999%) elemental titanium (for the bond coating) and titanium aluminum (33 at. % Ti-67 at. % Al) for the top coating to enhance corrosion protection at elevated temperature), which were individually evaporated by Miller XMT 304 CC/CV DC welder power supplies. These cathodes were cylindrical with a diameter of 6.3 cm and a thickness of 3.2 cm and were oriented 1800 from each other with the ZIRLO™ coupons located between the cathodes with a spacing of 22.9 cm. The plasma density and location were controlled by placing magnets behind the cathode targets. The samples were mounted in sample holders which were in turn mounted on an 8-post planetary rotation setup with shadow bars along the edge of each sample to avoid increased coating buildup along the sample edges. The substrate coupon temperature was 325 °C during coating deposition, as measured by thermocouples placed inside the deposition chamber.

At the cathode vaporization stage, $1.6\times10^{-3}$ Pa Ar atmosphere and −1000 V bias were applied to remove the native oxide from the substrate surface and improve coating adhesion. The ion preheat time used was 5 minutes in total. The deposition was conducted in two steps: bond layer deposition under Ar atmosphere using only the titanium cathode, followed by either TiAlN or TiN top coating reactive deposition performed under $N_2$ atmosphere at an approximate deposition rate of 0.028 μm/min (1.68 m/hour) by using only one titanium aluminum or titanium cathode target. The system is capable of using three sources simultaneously which could be used to double or triple the coating deposition rate, if needed. The thickness of the Ti bond layer applied was 0.6 μm and the substrate surface roughness was prepared to be 0.25 μm Ra. Coating properties specific for each sample are provided in Table 1. The thickness of each layer ranged from 0.7 μm to 6 μm. The total layer thickness was around 10 μm which for the elements used provided a negligible neutronic penalty.

TABLE 3

Cathodic Arc Physical Vapor Deposition Parameters for monolithic TiN and multilayer TiN/TiAlN coating fabrication.

| ID | Coating | Deposition time (BC/TC), (min) | Total coating Thickness, (μm) |
|---|---|---|---|
| E21 | TiN | 8/450 | 8.1 |
| E22 | TiN(thin)/Ti1-xAlxN | (thick) 8/400/60 | 11.1 |
| E23 | TiN/$Ti_{1-x}Al_xN$ 2-layer | 8/225/225 | 11.8 |
| E24 | TiN/$Ti_{1-x}Al_xN$ 4-layer | 8/4 × 112.5 | 8.9 |
| E25 | TiN/$Ti_{1-x}Al_xN$ 8-layer | 8/8 × 56.25 | 9.8 |
| E26 | TiN/$Ti_{1-x}Al_xN$ 16-layer | 8/16 × 28.13 | 10.9 |

*BC = bond coat,
TC = Top coat

Corrosion testing was performed at Westinghouse in a static autoclave in pure water for 7-90 days at 360 °C and saturation pressure, corresponding to 18.7 MPa at this temperature. Weight gain measurements were performed following the autoclave test to assess the coating durability and corrosion resistance. Initial analyses using optical microscopy (OM) were conducted on 7 days autoclave tested samples to evaluate the deposited coating thickness and corrosion performance. Samples tested for 33 and 90 days were characterized in the same manner. The structural and morphological properties of the longer duration (33 and 90 days) tested post-autoclave samples were further characterized using X-ray diffraction (XRD), scanning electron microscopy (SEM) and energy dispersive X-ray spectroscopy (EDS). Both surface and cross-section analyses were performed. Surface analyses were conducted directly after the autoclave test without any surface treatment to preserve surface integrity. Analyses of cross section of samples coated were conducted after cutting the samples into half, mounting in cold mount epoxy, grinding and polishing. X-ray diffraction (XRD) studies were conducted on a PANalytical XPert Pro Multi-Purpose Diffractometer (MPD) instrument with 240 mm radius, fixed divergence slit (0.25°), receiving slit (0.25°), using Cu Kα(Kα1=1.54056 Å, Kα2=1.54443 Å) radiation. XRD analysis with Grazing Incidence (GI) and Bragg-Brentano (BB) scans were performed with a step size of 0.026° two-theta to reveal the phases formed during corrosion. GI scans were conducted at incidence angles of 0.5°, 1°, 5°, 10° or 15° to achieve the appropriate depth of penetration for the incident beam and to be able to distinguish phases at different layers of the coating. The penetration depth was estimated using PANalytical High Score software. Backscatter and secondary electron scanning electron microscopy (SEM) measurements were conducted using a FEI Quanta 200 Environmental SEM at 80 Pa pressure and 20 kV high voltage.

Multilayer coatings provide advanced functionality compared to the single layer coating by combining the beneficial properties of constituent coating layers. Multilayer architecture improves the corrosion tolerance of the coating, in other words when oxygen and hydrogen diffuses through one layer and forms boehmite phase resulting in the degradation and spallation of the exterior coating layer, the alternating layers act as new barriers for oxygen and hydrogen ingress.

Figure 8:
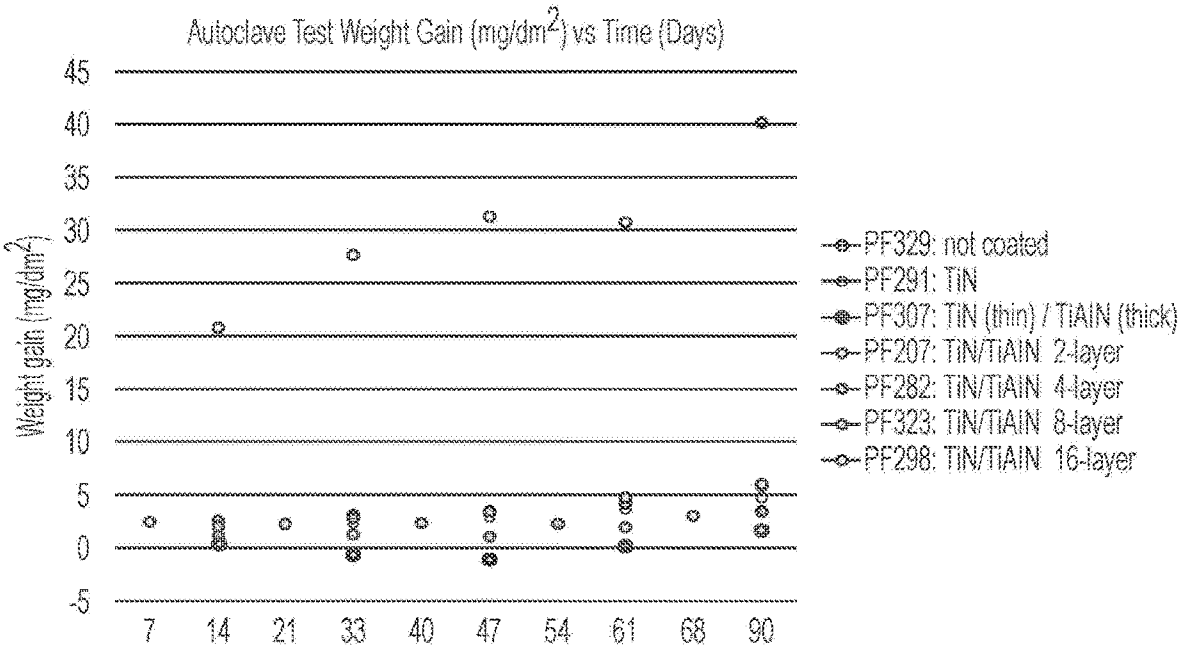
FIG. 8 is a chart of weight gain data obtained after an autoclave test at 360 °C and 18.7 MPa (saturation pressure) for 90 days of uncoated ZIRLO® and a number of samples with various coatings.

The weight gain data of these coated samples and uncoated ZIRLO™ are presented in FIG. 8. The coated samples showed an order of magnitude lower weight gain compared to the uncoated ZIRLO™. Thus the multilayer coating is capable of achieving better corrosion resistance than uncoated samples. The data also shows that multilayer architecture has a strong influence on corrosion properties as there is significant spread on the different multilayer. This indicates that the proper design of the multilayer is essential to achieve good corrosion protection.

Samples were autoclave tested for 7 days and characterized by OM. The average coating thickness was approximately 10 μm and so as the number of layers in the coating increased, the thickness of each individual layer decreased. Cross-sectional images of as-deposited samples show that coating layers were deposited with very uniform thickness over the substrate. After the autoclave test, the coatings are not much altered, showing no delamination/spallation indicating that weight gain data was only due to oxidation. Additionally, no boehmite phase formation was observed after the 7-day autoclave test, demonstrating that TiN acted as a barrier for aluminum migration towards the coating's outer surface, as expected. Considering the samples with lowest weight gain after the autoclave test, it was also possible to interpret the optimum layer thickness that would prevent boehmite phase formation. The TiN layer thickness in sample E22 was ~1 μm and ~1.2 μm in E25, which had a total coating thickness of ~9.8 μm composed of approximately equal TiN and TiAlN layers. This result suggests that a TiN thickness of ~1 μm was enough to avoid boehmite phase formation and achieve the lowest weight gain without spallation/delamination.

Characterization was performed on samples that were autoclave tested for 33 days to further investigate coating durability in high temperature water environment. While uncoated ZIRLO™ showed a weight gain of ~20 $mg/dm^2$, coated samples showed a weight gain around 1-3 $mg/dm^2$, again an order of magnitude lower than that of the uncoated sample. All samples showed positive weight gain, except TiN(thin)/TiAlN(thick), which indicates delamination/spallation in case of TiN (thin)/TiAlN (thick) coating. The exact mechanism of this delamination is not known, but it is attributed it to the unbalanced stresses due to thickness variation at each layer in the coating.

Weight gain data was previously presented in FIG. 8. Overall, samples that were autoclave tested for 90 days demonstrated a weight gain in the range of 1.6-6.0 mg/$dm^2$. These weight gain values are much lower than that of uncoated ZIRLO™ sample which had a weight gain of 40 mg/$dm^2$ after 90 days autoclave test. Weight gain data showed that, in addition to TiN(thin)/TiAlN(thick) sample, the 2- and 4-layered coatings also showed some weight loss after 50 days, indicating spallation/delamination of the coating. This was followed by a weight increase trend due to oxidation. Samples coated with TiN, TiN/TiAlN 8-layer and 16-layer showed no decrease in the weight gain data during 90 days, suggesting that these coatings were able to withstand high temperature water corrosion environment without spallation/delamination. Among these two multilayered coating designs (8- and 16-layered), 8-layered samples showed minimum positive weight gain. Thus, the TiN/TiAlN 8-layer coating was determined to be the optimum architecture that makes it possible to stop boehmite phase formation with ~1 μm thickness TiN layer, to show good adhesion, and to have the lowest weight gain without spallation or delamination.

In previous experiments, monolithic TiN and TiAlN coatings were applied in an attempt to develop an accident tolerant fuel with a cladding that can resist corrosion for longer durations. It was determined that both types of coatings adhered well to ZIRLO™ substrate with a surface roughness of 0.25 μm Ra and using a Ti bond coating layer with a thickness of 0.6 μm. Coating deposition parameters were also optimized to achieve a coating which could withstand autoclave testing at 360 °C and 18.7 MPa saturation pressure for 3 days. However, non-uniform boehmite phase formation was observed on the surface of TiAlN coatings after the autoclave testing due to the reaction of water and depleted aluminum from the coating, which was determined to be prevented with the removal of Al from the TiAlN coating and applying a TiN layer. Thus, it was discovered that multilayer coatings with a top coat not including aluminum, such as TiN as the top layer, can act as a barrier for the boehmite phase formation.

From the results of the foregoing experiments, we conclude that TiN/TiAlN multilayer coatings showed approximately an order of magnitude lower weight gain compared to uncoated ZIRLO™ substrate and no delamination or spallation indicating lower oxidation. Only a thin layer of (~1 μm) TiN is needed under the system tested as a barrier to terminate Al migration and prevent boehmite phase formation. All coatings were able to withstand the autoclave test without any spallation/delamination up to 7 days and most of them were maintained on the surface up to 33 days. At the end of 90 days, TiN/TiAlN 8-layer architecture coatings showed the best corrosion performance at 360 °C and 18.7 MPa (saturation pressure) compared to other tested multilayer architectures due to no boehmite phase formation, approximately linear weight gain data without any delamination/spallation and oxygen ingress prevention.

Only the preferred embodiment of the present invention and examples of its versatility are shown and described in the present disclosure. It is to be understood that the present invention is capable of use in various other combinations and environments and is capable of changes or modifications within the scope of the inventive concept as expressed herein. Thus, for example, those skilled in the art will recognize, or be able to ascertain, using no more than routine experimentation, numerous equivalents to the specific substances, procedures and arrangements described herein. Such equivalents are considered to be within the scope of this invention, and are covered by the following claims.

What is claimed is:

1. A method of providing nuclear fuel cladding in a radioactive fuel reactor, the method comprising the steps of:
- coating the nuclear fuel cladding with a coating system, the coating system including:
  - a multilayer coating on a substrate including (i) a bond coat layer on the substrate, the bond coat layer comprising metals or alloys, the bond coat layer having a thickness of between 0.2 μm to 1.5 μm, (ii) adjacent ceramic layers on the bond coat layer, at least one of the adjacent ceramic layers including a ternary metal compound, and at least one of the adjacent ceramic layers including a binary metal compound, (iii) a top coat layer that does not include aluminum;
  - wherein the ternary metal compound includes TiAlN, TiCrN, TiNbN, TiSiN, TiHfN, TaHfN, TaNbN, TiCrC, TiNbC, TiSiC, TiHfC, TaHfC, TaNbC, TiCrCN, TiNbCN, TiSiCN, TiHfCN, TaHfCN, TaNbCN or combinations thereof; and
- exposing the nuclear fuel cladding in pure water at at least 360 °C and a saturation pressure of 18.7 MPa while maintaining the coating system without spallation or delamination for at least a period of time in a range of 3 to 90 days.

2. The method according to claim 1, wherein the binary metal compound is TiN, CrN, HIN, TaN, NbN, CrC, HfC, TaC, NbC, or carbon-nitride of Cr, Hf, Ta, Nb.

3. The method according to claim 1, wherein the top coat layer comprises CrN.

4. The method according to claim 1, wherein each of the adjacent ceramic layers have a thickness greater than 0.1 μm.

5. The method according to claim 1, wherein the multilayer coating includes from 4-20 layers.

6. The method according to claim 1, wherein the adjacent ceramic layers comprises alternating layers of TiAlN and TiN with the top coat layer including TiN or alternating layers of TiCrN and CrN with the top coat layer including CrN.

7. The method according to claim 1, wherein at least one of the adjacent ceramic layers is doped with one or more dopants.

8. The method according to claim 7, wherein the dopant is one or more of Yb, Y, Hf, and/or Zr.

9. The method according to claim 8, wherein the dopant is in an amount of 0.1 atomic % to 25 atomic %.

10. The method according to claim 1, wherein coating the nuclear fuel cladding comprises coating by either a physical vapor deposition (PVD) coating process, or chemical vapor deposition (CVD), or a mixed PVD/CVD system.

11. The method according to claim 1, wherein the bond coat layer has a thickness of between 0.4 μm to 1.5 μm.

12. A method of providing nuclear fuel cladding in a radioactive fuel reactor, the method comprising the steps of:
- coating the nuclear fuel cladding with a coating system, the coating system including:
  - a multilayer coating on the substrate including (i) a bond coat layer on the substrate, the bond coat layer comprising metals or alloys, the bond coat layer having a thickness of between 0.2 μm to 1.5 μm, (ii) at least one layer including at least a ternary metal compound and at least one layer including at least a binary metal compound on the bond coat layer, and (iii) a top coat layer that does not include aluminum;

wherein the ternary metal compound includes TiAlN, TiCrN, TiNbN, TiSiN, TiHfN, TaHfN, TaNbN, TiCrC, TiNbC, TiSiC, TiHfC, TaHfC, TaNbC, TiCrCN, TiNbCN, TiSiCN, TiHfCN, TaHfCN, TaNbCN, or combinations thereof and the binary metal compound includes TiN, CrN, NbN, TaN, Si3N4, HIN, CrC, HfC, TaC, NbC or combinations thereof; and exposing the nuclear fuel cladding in pure water at at least 360 °C and a saturation pressure of 18.7 MPa while maintaining the coating system without spallation or delamination for at least a period of time in a range of 3 to 90 days.

13. The method according to claim 12, wherein the ternary metal compound is TiAlN and the binary compound is TiN or the ternary metal compound is TiCrN and the binary compound is CrN.

14. The method according to claim 12, wherein coating the nuclear fuel cladding comprises coating by either a physical vapor deposition (PVD) coating process, or chemical vapor deposition (CVD), or a mixed PVD/CVD system.

* * * * *